(12) United States Patent
Kipp et al.

(10) Patent No.: US 6,571,629 B1
(45) Date of Patent: Jun. 3, 2003

(54) MICROMECHANICAL SPRING STRUCTURE, IN PARTICULAR, FOR A ROTATION RATE SENSOR

(75) Inventors: Andreas Kipp, Reutlingen (DE); Joerg Hauer, Reutlingen (DE); Siegbert Geotz, Gerlingen (DE); Markus Lutz, Sunnyvale, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/913,478
(22) PCT Filed: Nov. 25, 2000
(86) PCT No.: PCT/DE00/04193
§ 371 (c)(1), (2), (4) Date: Nov. 26, 2001
(87) PCT Pub. No.: WO01/44823
PCT Pub. Date: Jun. 21, 2001

(30) Foreign Application Priority Data

Dec. 16, 1999 (DE) .......................................... 199 60 604

(51) Int. Cl.$^7$ ................................................ G01P 9/00
(52) U.S. Cl. .................................................... 73/504.14
(58) Field of Search ......................... 73/504.14, 504.12

(56) References Cited

U.S. PATENT DOCUMENTS 5,631,422 A    5/1997    Sulzberger et al.

FOREIGN PATENT DOCUMENTS

| DE | 197 10 601 | 11/1998 |
| DE | 198 17 357 | 10/1999 |
| GB | 2 192 718 | 1/1988 |

Primary Examiner—Richard A. Moller
(74) Attorney, Agent, or Firm—Kenyon & Kenyon

(57) ABSTRACT

A micromechanical spring structure, in particular for a rotation rate sensor, includes a first and a second cooperating elastic bar, segments of which run largely parallel to each other and segments of which are coupled with one another. The first and second elastic bars have a common curved area in which they are coupled with one another by a connecting area. A first transitional area to the connecting area, located between the first and second elastic bars, forms a largely smooth curve.

11 Claims, 3 Drawing Sheets

SECTION A-A'

US 6,571,629 B1

MICROMECHANICAL SPRING STRUCTURE, IN PARTICULAR, FOR A ROTATION RATE SENSOR

FIELD OF THE INVENTION

The present invention relates to a micromechanical spring structure, in particular for a rotation rate sensor, having a first and a second cooperating elastic bar, segments of which run largely parallel to each other and segments of which are coupled with one another. Although it can be applied to any suitably appropriate micromechanical spring structure, the exemplary embodiments of the present invention are explained in reference to a micromechanical rotation rate sensor.

BACKGROUND INFORMATION

FIG. 4 shows a schematic top view of a micromechanical spring structure for a rotation rate sensor. In FIG. 4, reference number 10 designates a first elastic bar and 12 a second elastic bar. Reference number 15 is a connecting area in which first and second elastic bars 10, 12 are coupled with one another.

It is believed that such a micromechanical spring structure may have the disadvantage that, when sharp bends occur in connecting area 15, stress peaks may arise at the largely right-angle transitions between elastic bars 10, 12 and connecting area 15. In the worst case, this may result in cracks or complete destruction of connecting area 15.

SUMMARY OF THE INVENTION

An exemplary embodiment of the present invention concerns a particular design of the spring geometry. In particular, the first and second elastic bars have a common curved area in which they are coupled with one another by a connecting area. A first transitional area to the connecting area, located between the first and second elastic bars, forms a largely smooth curve. A curved area in this context means that either a curvature is constantly present in this area or a curve is produced here during operation.

It is believed that this type of geometry has the advantage that it may minimize or at least reduce stresses in the connecting area so that damage virtually cannot occur there or is at least limited.

According to another exemplary embodiment, the first and second elastic bars have a first widened area that merges with the first transitional area. It is believed that this has the advantage that it may further reduce any stresses that occur.

According to another exemplary embodiment, the first widened area narrows in a largely linear or trapezoidal manner as the distance from the first transitional area increases. It is believed that this may have the advantage of maintaining low stress values in the direction of operation and with respect to drop strength. The effect this can achieve is to distribute stresses and significantly reduce the stress maximum.

According to another exemplary embodiment, the first and second elastic bars are attached to a mainland area that is connected to a substrate, or to an island area that floats above the substrate. A second transitional area to the mainland area or the island area has a largely smooth curve. Smooth or smooth-curvature transitions in the attachment to the mainland and island, respectively, prevent stress peaks from occurring in these areas.

According to another exemplary embodiment, the first and second elastic bars have a second widened area that merges with the second transitional area. It is believed that this may have the advantage that it may further reduce any stresses that occur.

According to another exemplary embodiment, the second widened area narrows in a largely linear or trapezoidal manner as the distance from the transitional area increases. It is believed that this may have the advantage of maintaining low stress values in the direction of operation and with respect to drop strength.

According to another exemplary embodiment, at least one of the first and second elastic bars may have a circular third widened area that has a central attachment area for attachment to the substrate. It is believed that this may be an advantageous coupling method for suppressing natural frequencies while maintaining production safety during gas phase etching.

According to another exemplary embodiment, the first and second elastic bars have a double-U structure, and the connecting area is located in the double-U bend. It is believed that this structure has favorable symmetry. It is also believed that the double-U spring shape may be useful for providing two printed conductors of the same width that are insulated against one another on the elastic bars. It is also believed that the elastic bar structure of a single-U spring may have to be at least twice as wide, and thus at least twice as long, to achieve the same rigidity. The chip area is thus always much smaller when implementing a double-U spring. The two elastic bars are mechanically connected in the U-curve so that no acceleration components should arise orthogonally to the direction of vibration during resonant operation.

An acceleration component of this type would be active in the detection direction of a Coriolis rotation rate sensor that uses the spring structure and thus produce a quadrature, i.e., a spurious signal in the output voltage. In this exemplary embodiment, the connection is arranged to minimize or at least reduce any stresses occurring in the direction of movement and in the z-direction.

According to another exemplary embodiment, first and second printed conductor devices are attached to the first and second elastic bars for effectively insulating, i.e., separating, two printed conductors of equal width against one another.

According to another exemplary embodiment, the structure may be produced by silicon surface micromechanics or silicon surface micromechanics in conjunction with silicon bulk micromechanics, or a different micromechanical technology.

DETAILED DESCRIPTION

In the figures, the same reference numbers designate the same, functionally comparable or corresponding components.

Figure 1:
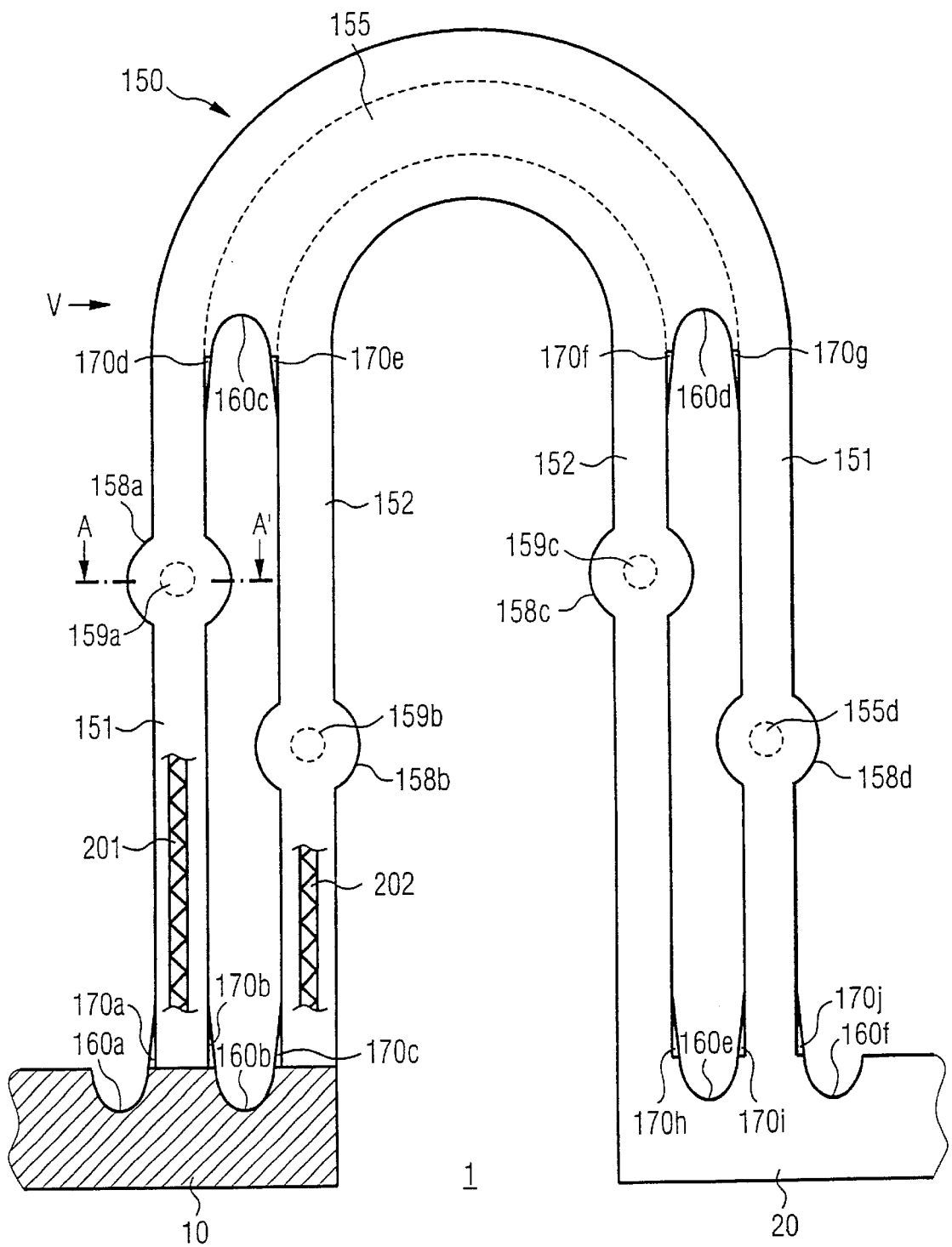
FIG. 1 shows a schematic top view of an exemplary embodiment of the micromechanical spring structure according to the present invention as part of a rotation rate sensor.

FIG. 1 shows a schematic top view of an exemplary embodiment of the micromechanical spring structure according to the present invention as part of a rotation rate sensor.

In FIG. 1, reference number 151 designates a first elastic bar and 152 a second elastic bar, which both have a double-U structure. First and second elastic bars 151, 152 have a common U-shaped curved area 15G, where they are coupled with one another by a special connecting area 155. In other words, 15 connecting area 155 is a continuous bridge between both elastic bars 151, 152. Both elastic bars 151, 152 connect a mainland area 10, attached to a substrate 1, to an island area 20 that floats above substrate 1. A first and second printed conductor device 201, 202 are attached to first and second elastic bar 151, 152 and insulated against one another.

Figure 4:
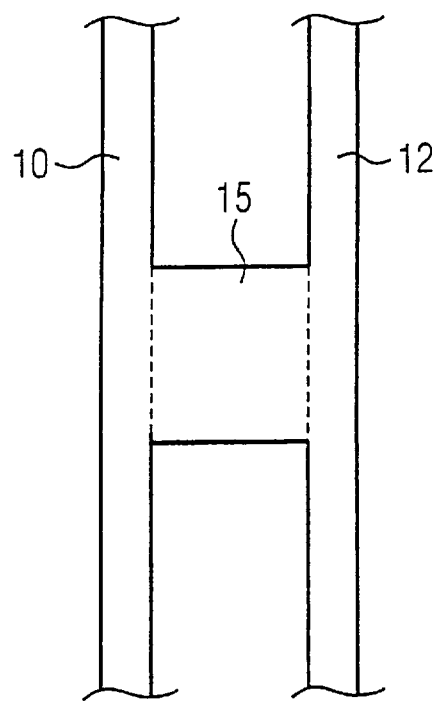
FIG. 4 shows a schematic top view of the micromechanical spring structure discussed in the Background Information.

Reference numbers 160c and 160d each designate a first semicircular transitional area between first and second elastic bars 151, 152 and connecting area 155. This transitional area 160c, 160d has a largely smooth curve. This means that the curvature increases and decreases uniformly and does not have a sharp bend, as is produced, for example, by the right angle according to the structure shown in FIG. 4. This is for reducing stress peaks.

Figure 2:
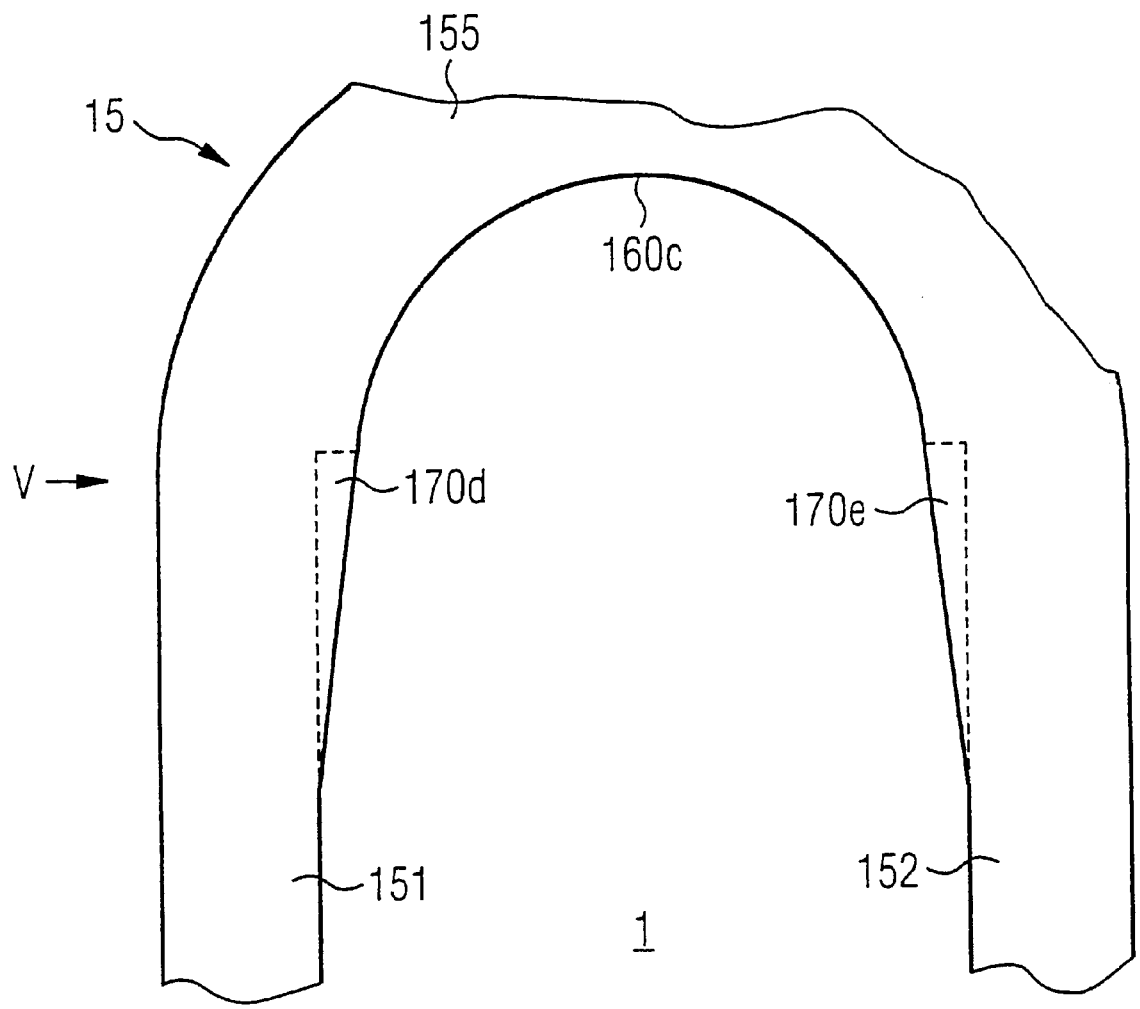
FIG. 2 shows an enlarged section of FIG. 1 in area V.

As shown in FIG. 1 and the enlarged section of area V illustrated in FIG. 2, widened areas 170d, 170e and 170f, 170g, respectively, which also form a largely smooth curve in first transitional area 160c and 160d, respectively, are provided at the ends of first and second elastic bar 151, 152. In this exemplary embodiment, first widened areas 170d, 170e and 170f, 170g, respectively, merge in a largely linear fashion with elastic bars 151 and 152, respectively. In other words, they narrow in a linear manner.

Corresponding second semicircular transitional areas 160a, 160b and 160e, 160f, respectively, are provided on mainland area 10 and island area 20, respectively. Here, elastic bars 151 and 152, respectively, merge in a continuous curve with mainland area 10 and island area 20, respectively. Like in connecting area 155, a widened area 170a, 170b, 170c, 170h, 170i, 170j is also provided here, which narrows in a largely linear manner as the distance from transitional areas 160a, 160b and 160e, 160f, respectively, increases. It is therefore possible to minimize or at least reduce stress peaks in these locations as well. This should be the case where the elastic bars merge in a straight line with mainland area 10 and island area 20, respectively, i.e., on the inner sides of the double-U structure.

Figure 3:
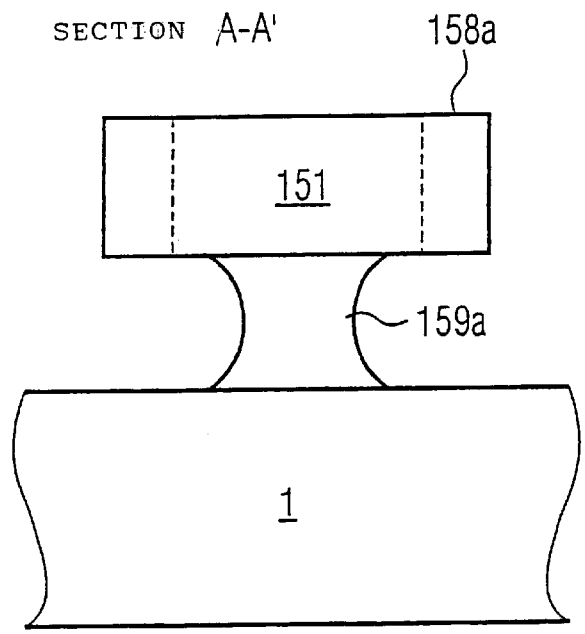
FIG. 3 shows a cross-section of FIG. 1 along Line or Section A–A'.

Both elastic bars 151, 152 also have circular third widened areas 158a through 158d, which include a central attachment area 159a through 159d for attachment to the substrate, as shown in FIG. 3, which illustrates a cut along Line or Section A–A' shown in FIG. 1.

The micromechanical spring structure according to this exemplary embodiment is intended for a known rotation rate sensor in which a rotation rate is converted to a linear acceleration according to the Coriolis principle.

The micromechanical spring structure illustrated in FIGS. 1 through 3 is produced by silicon surface mechanics combined with silicon bulk micromechanics. A silicon dioxide sacrificial layer is provided for this purpose on silicon substrate 1, and a polysilicon layer, in turn, is epitaxially deposited on the silicon dioxide sacrificial layer.

The spring structure is then formed by a trench etching process, after which the silicon dioxide sacrificial layer is removed in an etching process wherever the polysilicon is to move freely in relation to substrate 1.

According to FIG. 1, the polysilicon micromechanical spring structure connects mainland area 10, which is also made of polysilicon and is connected via the silicon dioxide sacrificial layer to a substrate 1, to island area 20, which is also made of polysilicon and is permanently connected to substrate 1 while remaining able to move freely.

To provide the mechanical connection between the substrate and the epitaxial polysilicon, it is believed that it may be necessary for the silicon dioxide to remain, with a defined surface of attack, on the substrate and on the epitaxial polysilicon. It is believed that the described exemplary embodiment meets this requirement in the circular widened areas and in connecting area 155 for connecting the double-U curves.

Finite-element simulations, which can very effectively describe the mechanical processes observed, can be used for the specific elastic bar design. Patterns can be used to verify that the spring structure according to the exemplary embodiments of the present invention provides a mechanically stable connection between the substrate and the epitaxial polysilicon.

The geometry of the spring structure is not limited to the exemplary embodiments shown. However, major deviations from the symmetrical shape should be avoided if there is a danger of linear components of the external acceleration corrupting the measurement results.

The production method is only exemplary and other suitably appropriate methods, such as electroplating methods, can also be used to produce the micromechanical spring structure.

What is claimed is:

1. A micromechanical spring structure for a rotation rate sensor, comprising:

a first cooperating elastic bar;
   a second cooperating elastic bar;
   wherein:
      first segments of the first and second cooperating elastic bars run largely parallel to each other and second segments of the first and second cooperating elastic bars are coupled with each other;
      the first and second cooperating elastic bars have a common curved area in which they are coupled with each other by a connecting area; and
      a first transitional area to the connecting area is located between the first and second cooperating elastic bars and forms a largely smooth curve.

2. The micromechanical spring structure of claim 1, wherein the first and second cooperating elastic bars include a first widened area that merges with the first transitional area.

3. The micromechanical spring structure of claim 2, wherein the first widened area narrows in one of a largely linear manner and a trapezoidal manner as a distance from the first transitional area increases.

4. The micromechanical spring structure of claim 3, wherein:
   the first and second cooperating elastic bars are attached to a mainland area that is connected to one of a substrate and an island area that floats above the substrate; and
   a second transitional area to the one of the mainland area and the island area forms another largely smooth curve.

5. The micromechanical spring structure of claim 4, wherein the first and second cooperating elastic bars include a second widened area that merges with the second transitional area.

6. The micromechanical spring structure of claim 5, wherein the second widened area narrows in one of a largely linear manner and a trapezoidal manner as a distance from the second transitional area increases.

7. The micromechanical spring structure of claim 5, wherein at least one of the first and second cooperating elastic bars includes a third widened area having a central attachment area for attachment to the substrate.

8. The micromechanical spring structure of claim 1, wherein the first and second cooperating elastic bars include a double-U structure, and the connecting area is located in a bend of the double-U structure.

9. The micromechanical spring structure of claim 1, wherein first and second printed conductor devices are attached to the first and second cooperating elastic bars.

10. The micromechanical spring structure of claim 1, wherein the micromechanical spring structure is produced by at least one of a silicon surface micromechanical technology and a micromechanical technology.

11. The micromechanical spring structure of claim 7, wherein the third widened area includes a circular widened area.

* * * * *